United States Patent
Dietrich et al.

(10) Patent No.: US 6,532,188 B2
(45) Date of Patent: Mar. 11, 2003

(54) INTEGRATED MEMORY HAVING A ROW ACCESS CONTROLLER FOR ACTIVATING AND DEACTIVATING ROW LINES

(75) Inventors: Stefan Dietrich, Türkenfeld (DE); Thomas Hein, München (DE); Patrick Heyne, München (DE); Thilo Marx, Villingen-Schwenningen (DE); Torsten Partsch, Chapel Hill, NC (US); Sabine Kieser, Hausham (DE); Peter Schroegmeier, München (DE); Michael Sommer, München (DE); Christian Weis, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/012,161

(22) Filed: Oct. 29, 2001

(65) Prior Publication Data

US 2002/0141279 A1 Oct. 3, 2002

(30) Foreign Application Priority Data

Oct. 27, 2000 (DE) .......................................... 100 53 425

(51) Int. Cl.⁷ ................................................ G11C 8/00
(52) U.S. Cl. .................... 365/233; 365/230.06; 365/194
(58) Field of Search ........................... 365/233, 230.06, 365/230.08, 233.5, 185.23, 194

(56) References Cited

U.S. PATENT DOCUMENTS

| | | | |
|---|---|---|---|
| 5,740,121 A | 4/1998 | Suzuki et al. | ................ 365/233 |
| 6,115,319 A | 9/2000 | Kinoshita et al. | ............ 365/233 |
| 6,396,755 B2 * | 5/2002 | Dietrich et al. | ............. 365/233 |
| 6,438,067 B2 * | 8/2002 | Kuge et al. | .................. 365/233 |

* cited by examiner

Primary Examiner—Tan T. Nguyen
(74) Attorney, Agent, or Firm—Laurence A. Greenberg; Werner H. Stemer; Ralph E. Locher

(57) ABSTRACT

An integrated memory is described which has a memory cell array with column lines and row lines. A row access controller serves for activating one of the row lines and for controlling a deactivation operation. An input of a control unit is connected to a signal terminal for a signal that, in the event of a read access to one of the memory cells, defines the beginning of data outputting to a point outside the memory cell array. The data output is synchronized with a clock signal. In this case, the signal is adjustable depending on an operating frequency of the memory. An output signal of the control unit serves for triggering the deactivation operation of one of the row lines after a write access. Therefore, in the event of a write access, a comparatively high data throughput is possible even at different operating frequencies of the integrated memory.

4 Claims, 1 Drawing Sheet

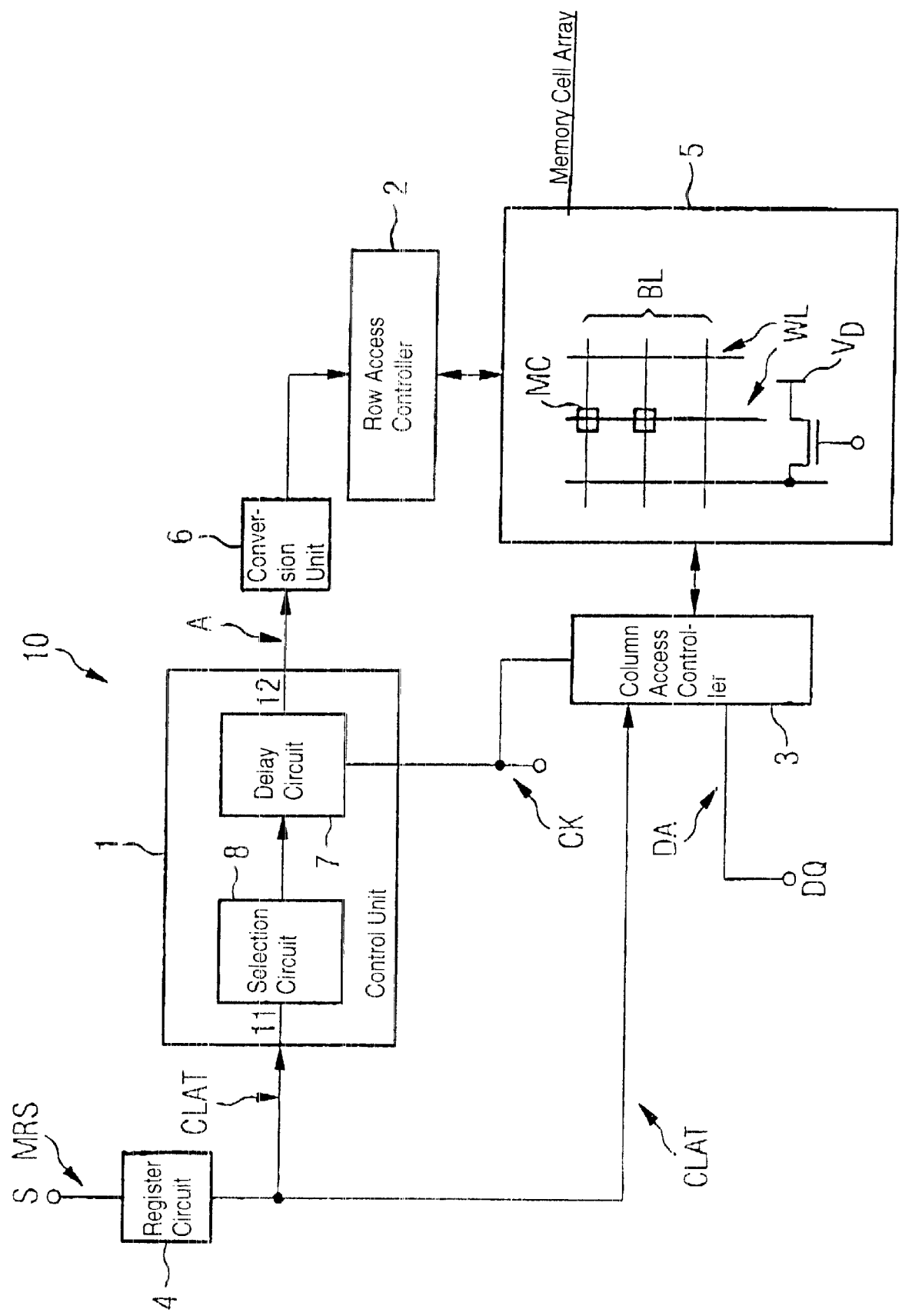

INTEGRATED MEMORY HAVING A ROW ACCESS CONTROLLER FOR ACTIVATING AND DEACTIVATING ROW LINES

BACKGROUND OF THE INVENTION

Field of the Invention

The present invention relates to an integrated memory having a memory cell array with column lines and row lines. The cell array has memory cells, which are each connected to one of the row lines for selection of one of the memory cells and to one of the column lines for reading out or writing of a data signal. A row access controller is provided for activating one of the row lines for the selection of one of the memory cells and for controlling a deactivation operation for deactivating one of the row lines.

An integrated memory generally has a memory cell array containing the column lines and the row lines. The memory cells are in this case disposed at crossover points between the column lines and the row lines. For the selection of one of the memory cells, the latter are each connected to one of the row lines. To that end, by way of example, a selection transistor of respective memory cells is turned on by an activated row line, as a result of which a data signal of a corresponding selected memory cell can subsequently be read out or written. To that end, the selected memory cell is connected via the selection transistor to one of the column lines, via which the corresponding data signal is read out or written in.

In an inactive state, the row lines are usually deactivated, for example being precharged to a precharge potential or grounded. In other words, after the reading or writing of a data signal, the corresponding activated row line is deactivated by a deactivation operation. The deactivation operation and also the activation of one of the row lines for the selection of one of the memory cells are generally controlled by the row access controller.

In synchronous memories, in particular, such so-called SDRAMs or SGRAMs, the data processing speed is progressively increased owing to rising requirements by increasing the operating frequency (clock rate). As a result, the access time for an individual memory access is increasingly shortened. In this case, it must still be ensured that a defined minimum period of time is complied with in which a row line is to be activated for reading or writing a data signal. The minimum period of time is usually governed by physical constraints, for example by the length of the row line and the capacitive load connected therewith.

The minimum time in which a row line must remain open after a write operation in order to guarantee the memory cells are written to correctly is referred to as the so-called write recovery time. The time must be complied with in order that data cannot be lost during the write operation. In SDRAM or SGRAM memories, the write recovery time is usually a fixedly set time which is defined either as an analog time or as a time which is set in relation to a clock cycle. If a memory module is operated in a comparatively large frequency range, it can happen that, owing to a fixedly set write recovery time, the data throughput remains comparatively low even at a relatively high operating frequency of the memory.

SUMMARY OF THE INVENTION

It is accordingly an object of the invention to provide an integrated memory having a row access controller for activating and deactivating row lines which overcomes the above-mentioned disadvantages of the prior art devices of this general type, which has a comparatively high data throughput and is possible even at different operating frequencies of the integrated memory.

With the foregoing and other objects in view there is provided, in accordance with the invention, an integrated memory. The memory contains a memory cell array having column lines, row lines, and memory cells. Each of the memory cells is connected to one of the row lines for selecting one of the memory cells and to one of the column lines for reading out or writing of a data signal. A row access controller is connected to the row lines for activating one of the row lines for the selecting one of the memory cells and for controlling a deactivation operation for deactivating one of the row lines. A signal terminal for a signal and a clock terminal for receiving a clock signal are provided. A control unit having a first input connected to the clock terminal and a second input connected to the signal terminal for receiving the signal, is provided. In an event of a read access to one of the memory cells, the signal defines a beginning of data outputting to a point outside the memory cell array. The data outputting is synchronized with the clock signal, and the signal is adjustable in dependence on an operating frequency of the integrated memory. The control unit has an output coupled to the row access controller and outputs an output signal for triggering the deactivation operation of one of the row lines after a write access to one of the memory cells.

The object is achieved by an integrated memory of the type mentioned in the introduction having a control unit containing an input, which is connected to a signal terminal for a signal that, in the event of a read access to one of the memory cells, defines the beginning of data outputting to a point outside the memory cell array. The data outputting is synchronized with a clock signal, the signal being adjustable depending on an operating frequency of the memory, and an output, which is connected to the row access controller, for outputting an output signal for triggering the deactivation operation of one of the row lines after a write access to one of the memory cells.

The control unit makes it possible to set the write recovery time to depend on the operating frequency of the memory. As a result, this is defined as a frequency-dependent time variable and set accordingly by the control unit. As a result, the write recovery time can be optimized to the operating frequency, so that a comparatively high data throughput can be achieved even at different operating frequencies. As soon as the write recovery time has elapsed after a write access to one of the memory cells, the deactivation operation of the relevant row line is triggered by the output signal of the control unit.

In this case, the write recovery time is determined in a manner dependent on a so-called CAS latency signal. The signal indicates when synchronized data output to a point outside the memory cell array begins in the event of a read access to one of the memory cells. As a result, in the event of a read access, a data packet is obtained on a column line at a defined point in time. In synchronous memory modules, the CAS latency signal is usually programmed by a so-called mode register set command. In this case, the CAS latency signal is programmed and set depending on the operating frequency of the memory, in order to obtain an optimum data throughput at every operating frequency in the event of a read access to one of the memory cells. The signal is therefore suitable for drawing conclusions about the frequency range of the memory, and for being utilized for determining the write recovery time for a write access to one of the memory cells. This can be set in the control unit in a matching manner with respect to the operating frequency using the programmed CAS latency signal. The deactivation operation of one of the row lines is accordingly initiated by the output signal of the control unit.

In one embodiment of the invention, the control unit is connected to a terminal for the clock signal. The output signal of the control unit is derived from the clock signal, an instant of a switching edge of the output signal being defined, by the control unit, depending on the state of the CAS latency signal present at the input.

To that end, the control unit advantageously has a delay circuit, by which the clock signal can be delayed by one or more clock periods and can be output as an output signal. The triggering of the deactivation operation of one of the row lines is accordingly delayed by one or more clock periods of the clock signal by the delay circuit, thereby complying with the write recovery time.

The number of clock periods to be delayed can be set in a discrete manner, for example. To that end, the control unit advantageously has a selection circuit, which is connected to the delay circuit and to the input of the control unit. In this case, the number of clock periods to be delayed is set in the selection circuit by the CAS latency signal present at the input of the control unit. The selection circuit is connected to the delay circuit, which performs the corresponding delay of the clock signal depending on the output signal of the selection circuit.

Other features which are considered as characteristic for the invention are set forth in the appended claims.

Although the invention is illustrated and described herein as embodied in an integrated memory having a row access controller for activating and deactivating row lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a block diagram of an integrated memory according to the invention.

DESCRIPTION OF THE PREFERRED EMBODIMENTS

Referring now to the single FIGURE of the drawing in detail, there is shown an exemplary embodiment of an integrated memory 10 according to the invention. The memory 10 has a memory cell array 5 with column lines BL and row lines WL. Memory cells MC are disposed at crossover points between the row lines WL and the column lines BL and are each connected to one of the row lines WL and one of the column lines BL. This is only illustrated diagrammatically in the FIGURE, for the sake of clarity. Memory cells MC are selected via the respective row lines WL for a read or write operation. Via the column lines BL, a data signal DA is read from one of the memory cells MC or written to one of the memory cells MC. The reading out or writing in of the data signal DA is performed via a data output DQ. The latter is connected to a column access controller 3, by which the corresponding column line BL is selected.

A row access controller 2 serves for activating one of the row lines WL for the purpose of selecting one of the memory cells MC. The row access controller 2 likewise initiates a deactivation operation for deactivating the corresponding row line WL after activation thereof. For deactivation, the corresponding row line WL is connected to a deactivation potential VD via a switching device.

Connected to a terminal S of the memory 10 is a controller, for example. The latter transmits a so-called mode register set command MRS for storage in a register circuit 4. The MRS be command programs a so-called CAS latency for the memory 10. In this respect, a CAS latency signal CLAT is generated at an output of the register circuit 4. The signal is used, in the event of a read access to one of the memory cells MC, to define a beginning of data outputting to a point outside the memory cell array 5, the data outputting being synchronized with a clock signal CK. In this case, the CAS latency signal CLAT specifies a number of the clock signals CK which are allowed to elapse referring to the beginning of the read access, in order to read out the data signal DA. To that end, the CAS latency signal CLAT is connected to the column access controller 3. The latter is additionally connected to the clock signal CK, which can assume different clock frequencies.

The CAS latency signal CLAT is set in a manner dependent on the clock frequency of the clock signal CK by the MRS command. The dependence of the clock cycles that are to be allowed to elapse after the beginning of the read access for data outputting, the CAS latency signal CLAT, on the operating frequency of the clock signal CK is represented in the table below, which also contains the write recovery time TWR derived therefrom, which will be discussed later.

| CAS latency (clock cycles TCK) | Clock frequency (MHz) | TWR (clock cycles TCK) |
|---|---|---|
| 2 | <166 | 1 |
| 3,4 | 166–300 | 2 |
| >4 | >300 | 3 |

Relatively small CAS latencies can only be used in comparatively small frequency ranges. Accordingly, larger CAS latencies must be used in larger frequency ranges, since a period duration TCK of the clock signal CK is correspondingly shortened.

According to the invention, then, the frequency range in which the memory is operated can be inferred depending on the CAS latency set. With the knowledge of the frequency range, it is possible to define the associated write recovery time TWR for a write access to one of the memory cells.

To that end, the memory 10 has a control unit 1, whose input 11 is connected to a signal terminal for the CAS latency signal CLAT. An output 12 of the control unit 1 is connected to the row access controller 2 via a conversion circuit 6. The control unit 1 outputs an output signal A, which serves for triggering the deactivation operation of one of the row lines WL after a write access to one of the memory cells. The conversion circuit 6 and the row access controller 2 trigger the deactivation operation of one of the row lines in accordance with the switching instant of the output signal A referring to the beginning of the access. Further relevant settings for triggering the deactivation operation can be performed by the conversion circuit 6.

The control unit 1 has a delay circuit 7, which is connected to the terminal for the clock signal CK. The output signal A of the control unit 1 is derived from the clock signal CK. In this case, the clock signal CK is delayed by one or more clock periods and output as the output signal A. The delay circuit 7 is driven by a selection circuit 8, which is connected to an input 11 of the control unit 1. The number of clock periods to be delayed is set in a discrete manner using the CAS latency signal CLAT by the selection circuit 8.

The critical write recovery time TWR is set by way of the delay of the output signal A. As specified in the table represented above, the time TWR increases with the operating frequency of the clock signal CK. Therefore, for example, that, on account of higher operating frequencies, it is necessary to increase the number of clock periods to be delayed. As a result, the deactivation operation of the corresponding row line after a write access to one of the memory cells is triggered in a manner adapted to the operating frequency of the clock signal, thereby complying with the minimum time in which a row line must remain open after writing. The instant of the switching edge of the output signal A is defined depending on the state of the CAS latency signal CLAT at the input of the control unit 1.

We claim:

1. An integrated memory, comprising:

a memory cell array having column lines, row lines, and memory cells, each of said memory cells being connected to one of said row lines for selection of one of said memory cells and to one of said column lines for reading out or writing of a data signal;

a row access controller connected to said row lines for activating one of said row lines for the selection of one of said memory cells and for controlling a deactivation operation for deactivating one of said row lines;

a signal terminal for a signal;

a clock terminal for receiving a clock signal; and a control unit having a first input connected to said clock terminal and a second input connected to said signal terminal for receiving the signal, the signal which, in an event of a read access to one of said memory cells, defines a beginning of data outputting to a point outside said memory cell array, the data outputting being synchronized with the clock signal, the signal being adjustable in dependence on an operating frequency of the integrated memory, said control unit having an output coupled to said row access controller and outputting an output signal for triggering the deactivation operation of one of said row lines after a write access to one of said memory cells.

2. The integrated memory according to claim 1, wherein the output signal of said control unit is derived from the clock signal, said control unit is configured in such a way that an instant of a switching edge of the output signal is defined in dependence on a state of the signal present at said second input.

3. The integrated memory according to claim 2, wherein said control unit has a delay circuit connected to said output of said control unit, said delay unit provided for delaying the clock signal by one or more clock periods and can be output as the output signal.

4. The integrated memory according to claim 3, wherein said control unit has a selection circuit connected to said delay circuit and to said second input of said control unit, for discrete setting of a number of the clock periods to be delayed.

* * * * *